(12) United States Patent
Linnen et al.

(10) Patent No.: US 11,003,551 B2
(45) Date of Patent: May 11, 2021

(54) NON-VOLATILE STORAGE SYSTEM WITH PROGRAM FAILURE RECOVERY

(71) Applicant: SANDISK TECHNOLOGIES LLC, Addison, TX (US)

(72) Inventors: Daniel Linnen, Naperville, IL (US); Ashish Ghai, Saratoga, CA (US); Khanfer Kukkady, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 146 days.

(21) Appl. No.: 16/361,212

(22) Filed: Mar. 22, 2019

(65) Prior Publication Data

US 2020/0104219 A1 Apr. 2, 2020

Related U.S. Application Data

(60) Provisional application No. 62/737,243, filed on Sep. 27, 2018.

(51) Int. Cl.
| | |
|---|---|
| *G06F 11/00* | (2006.01) |
| *G06F 11/14* | (2006.01) |
| *G11C 16/10* | (2006.01) |
| *G11C 16/14* | (2006.01) |
| *G11C 16/26* | (2006.01) |
| *G11C 16/04* | (2006.01) |
| *G11C 16/34* | (2006.01) |

(52) U.S. Cl.
CPC .......... *G06F 11/1469* (2013.01); *G11C 16/10* (2013.01); *G11C 16/14* (2013.01); *G11C 16/26* (2013.01); *G06F 2201/82* (2013.01); *G11C 16/0483* (2013.01); *G11C 16/3459* (2013.01)

(58) Field of Classification Search
CPC ........................ G11C 16/3459; G06F 11/1048
See application file for complete search history.

(56) References Cited

U.S. PATENT DOCUMENTS

| | | | |
|---|---|---|---|
| 7,362,610 B1 | 4/2008 | Salter, III | |
| 7,916,533 B2 | 3/2011 | Dong | |
| 8,189,386 B2* | 5/2012 | Park | G11C 11/5628 |
| | | | 365/185.09 |
| 8,913,428 B2 | 12/2014 | Li | |
| 10,096,354 B1* | 10/2018 | Chevallier | G06F 11/1048 |
| 10,762,967 B2* | 9/2020 | Shappir | G11C 16/105 |
| 2006/0117393 A1 | 6/2006 | Merry, Jr. | |
| 2011/0051514 A1* | 3/2011 | Han | G06F 11/1048 |
| | | | 365/185.09 |

(Continued)

FOREIGN PATENT DOCUMENTS

CN 101465164 4/2013

*Primary Examiner* — Jonathan D Gibson
(74) *Attorney, Agent, or Firm* — Vierra Magen Marcus LLP

(57) ABSTRACT

A non-volatile storage apparatus receives first data from an entity external to the non-volatile storage apparatus, combines the first data with other data being stored in the non-volatile storage apparatus to create combined data, performs a programming process to program the first data into a first location, determines that the programming process failed, intentionally corrupts the first data programmed into the first location, recovers the first data from the combined data, and reprograms the recovered first into a second location.

19 Claims, 12 Drawing Sheets

(56) References Cited

U.S. PATENT DOCUMENTS

| | | | |
|---|---|---|---|
| 2011/0179322 A1* | 7/2011 | Lee | G06F 11/1048 |
| | | | 714/719 |
| 2013/0019054 A1 | 1/2013 | Jung | |
| 2018/0374552 A1* | 12/2018 | Hong | G11C 11/5671 |
| 2020/0005873 A1* | 1/2020 | Yazovitsky | G11C 16/349 |
| 2020/0005874 A1* | 1/2020 | Shappir | G11C 11/5628 |
| 2020/0089566 A1* | 3/2020 | You | G06F 11/1016 |

* cited by examiner

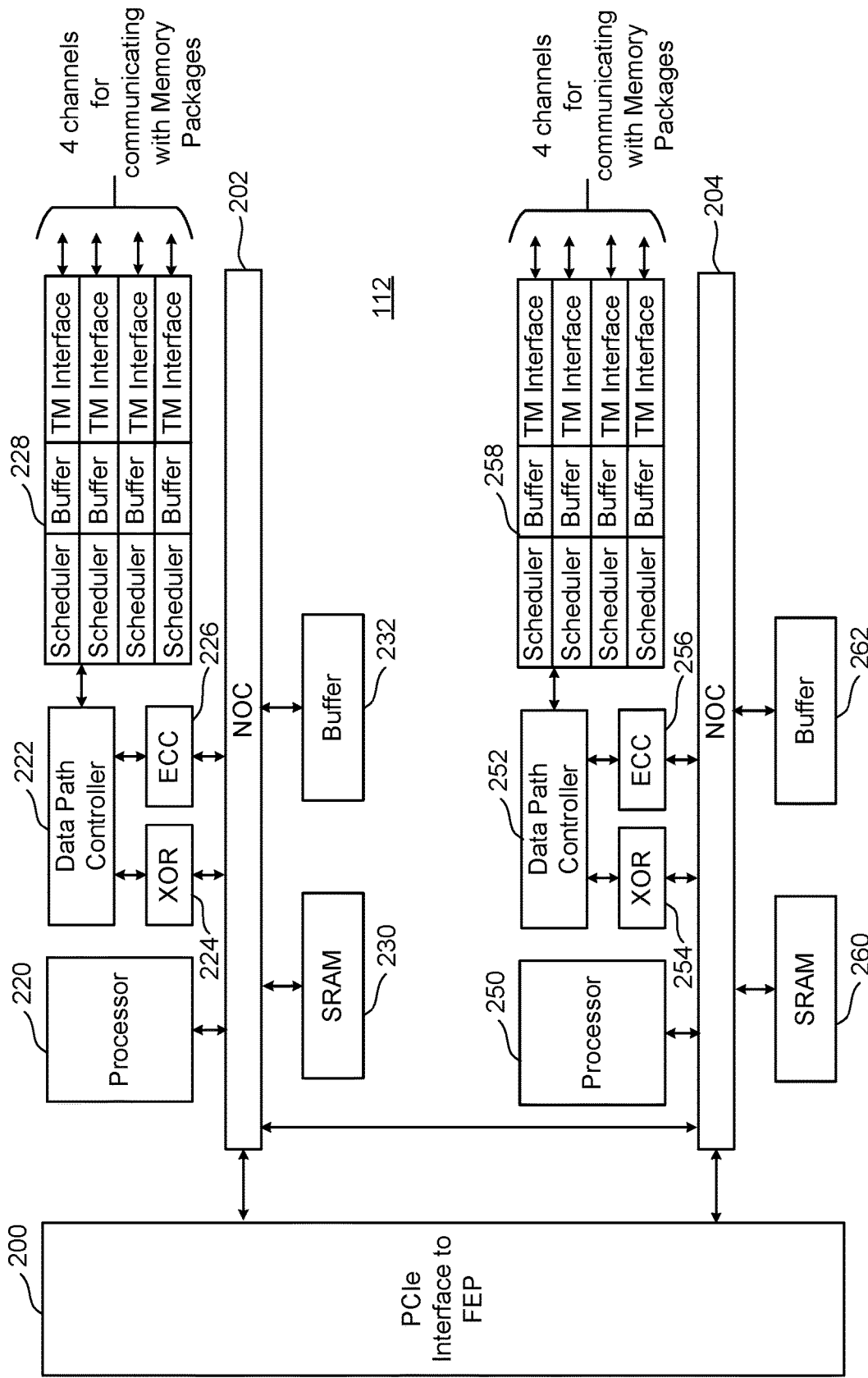

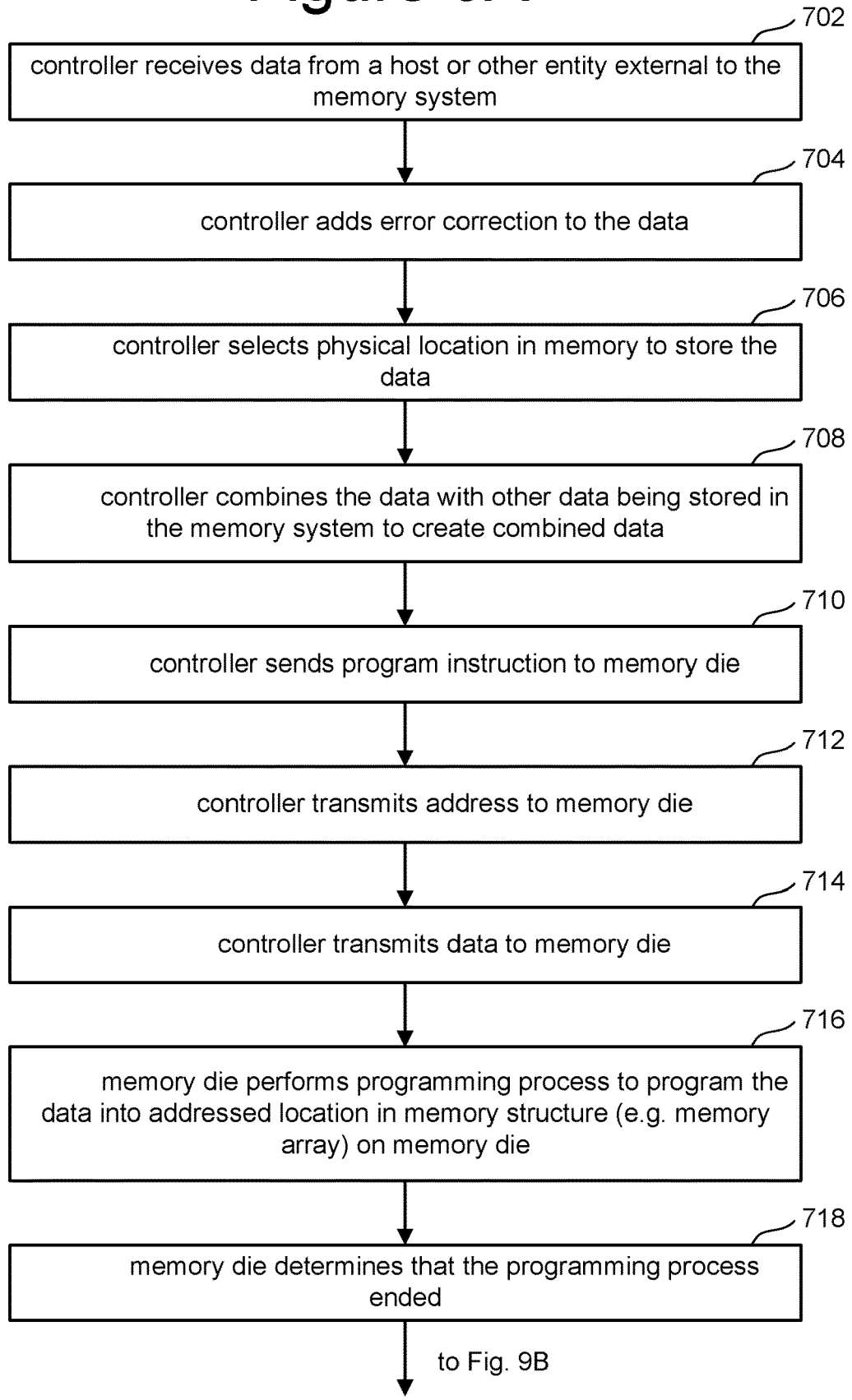

NON-VOLATILE STORAGE SYSTEM WITH PROGRAM FAILURE RECOVERY

This application claims priority to U.S. Provisional Application Ser. No. 62/737,243, filed on Sep. 27, 2018, titled "Non-Volatile Storage System With Program Failure Recovery," incorporated herein by reference in its entirety.

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Memory systems are used to store data. It is important that writing and reading are performed accurately so that data is not lost.

BRIEF DESCRIPTION OF THE DRAWINGS

Like-numbered elements refer to common components in the different figures.

FIG. 1C is a block diagram of one embodiment of a Back End Processor Circuit. In some embodiments, the Back End Processor Circuit is part of a controller.

FIGS. 9A and 9B together are a flow chart describing one embodiment of a process for operating a non-volatile storage apparatus to write data.

DETAILED DESCRIPTION

The memory system described herein includes a novel program failure behavior that catastrophically corrupts data of a failed/faulted programming process rather than giving up in a manner that preserves the damaged data and risks unrecoverable errors later on.

One embodiment includes a non-volatile storage apparatus that receives first data from an entity external to the non-volatile storage apparatus, combines the first data with other data being stored in the non-volatile storage apparatus to create combined data, performs a programming process to program the first data into a first location, determines that the programming process failed, intentionally corrupts the first data programmed into the first location, recovers the first data from the combined data, and reprograms the recovered first into a second location.

Figure 1A:
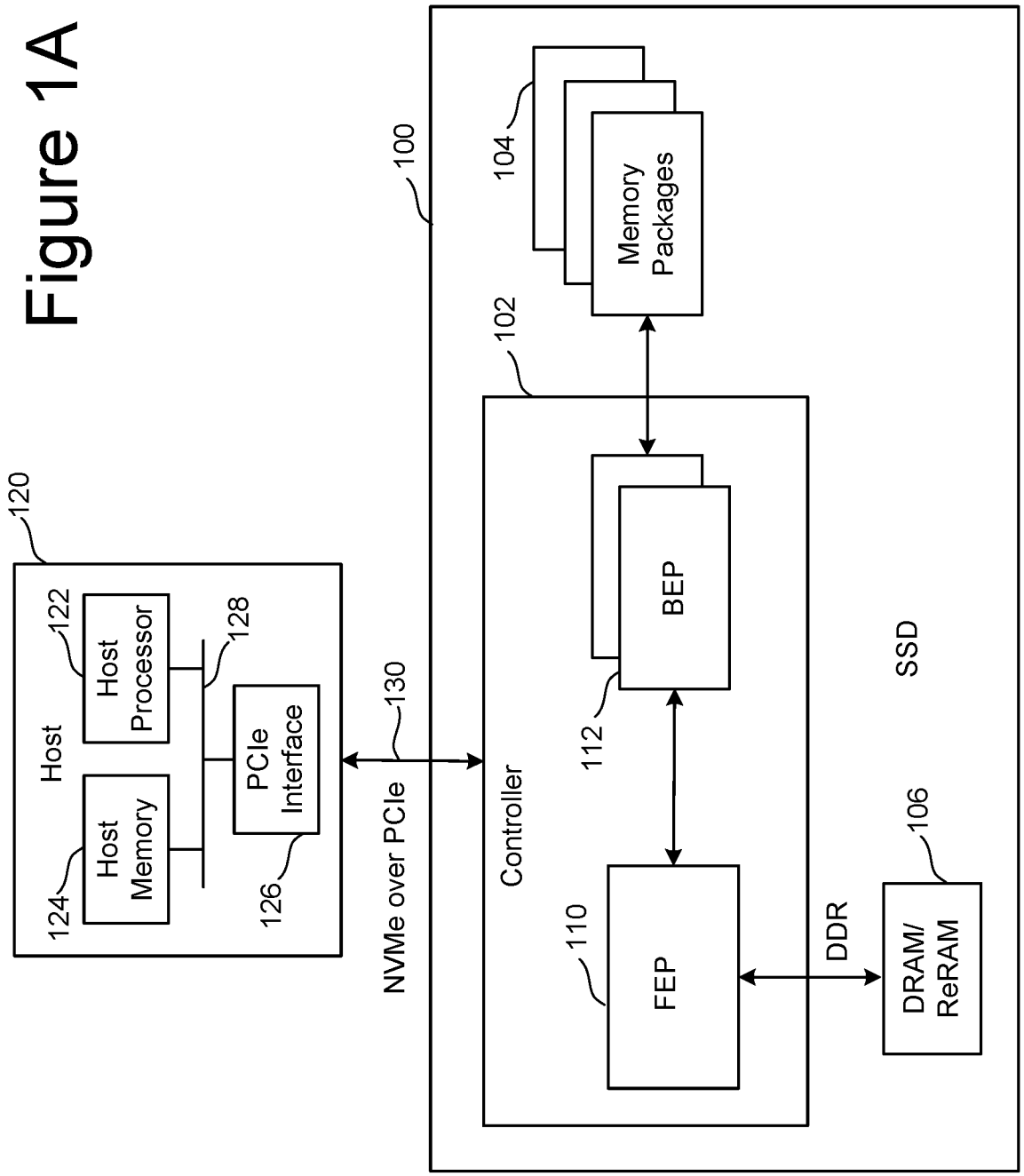
FIG. 1A is a block diagram of one embodiment of a memory system connected to a host.

FIG. 1A is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a controller 102, non-volatile memory 104 for storing data, and local memory (e.g. DRAM/ReRAM) 106. In one embodiment, controller 102 comprises a Front End Processor Circuit (FEP) 110 and one or more Back End Processor Circuits (BEP) 112. In one embodiment FEP circuit 110 is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Host 120 is one example of an entity that is external to memory system 100. Other examples of an entity that is external to memory system 100 include other computing devices (e.g., computers, servers, smart appliances, smart phones, etc.) that are connected to memory system 100 and other computing systems that are in communication with memory system 100 via any communication means (e.g., LAN, WAN, WiFi, wired connection, wireless connection, direct connection, indirect connection, etc.)

Figure 1B:
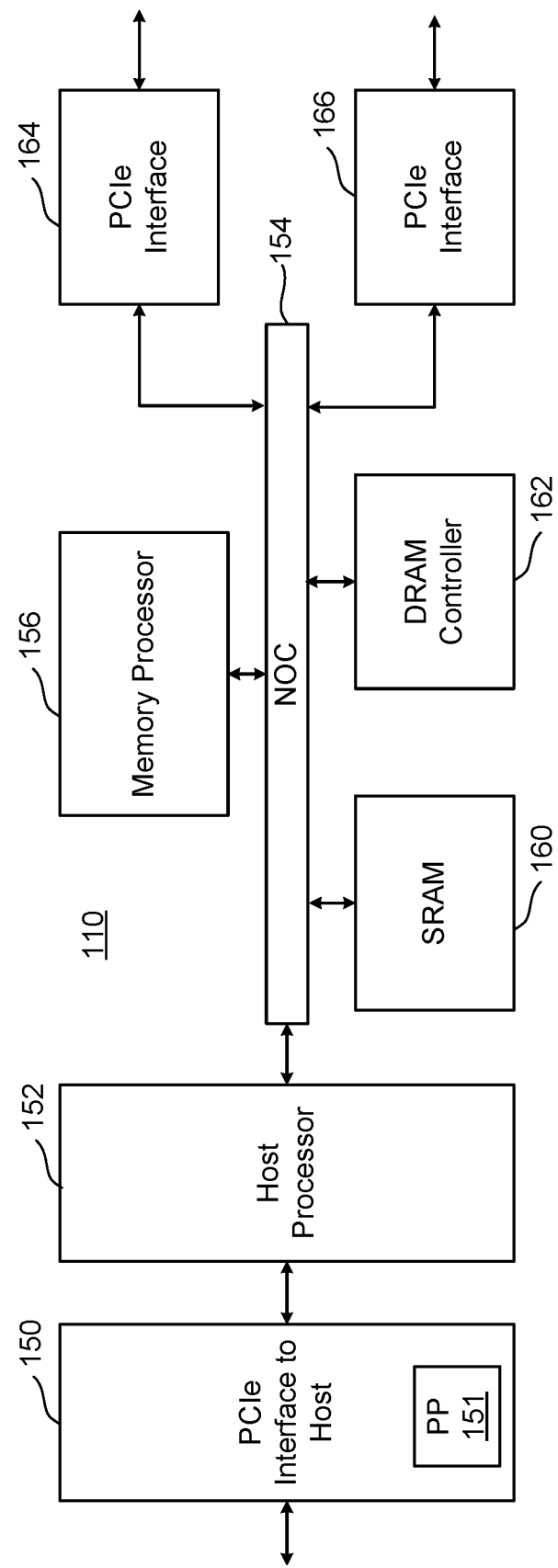
FIG. 1B is a block diagram of one embodiment of a Front End Processor Circuit. In some embodiments, the Front End Processor Circuit is part of a controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined (e.g. combine data) and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
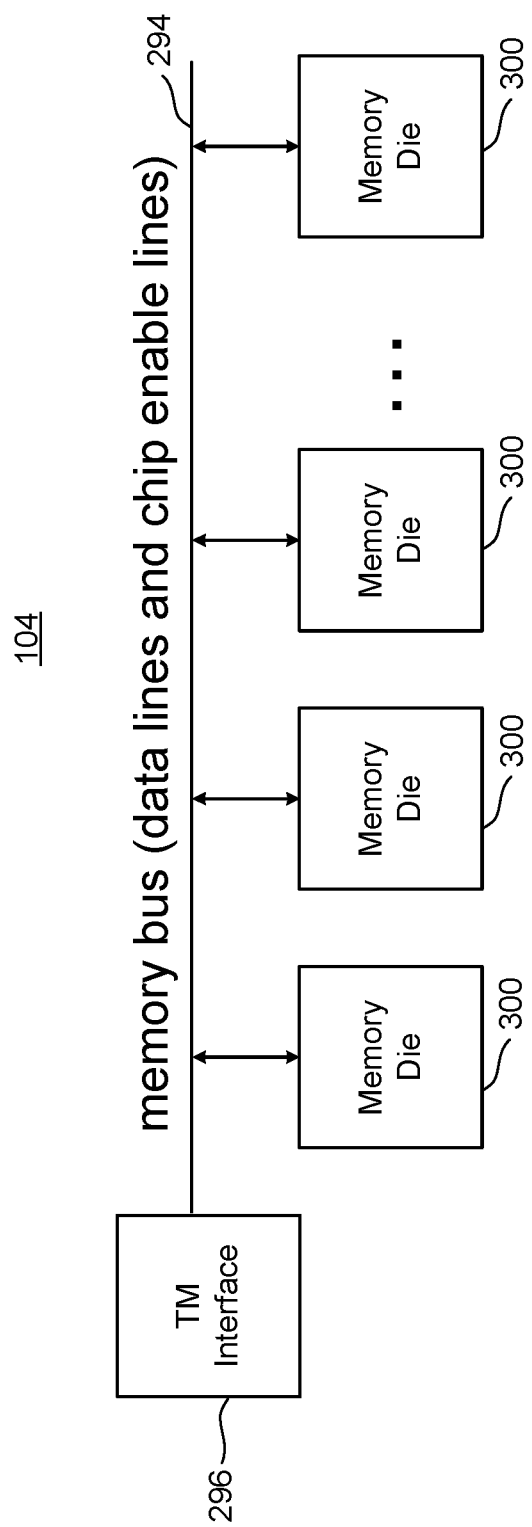
FIG. 1D is a block diagram of one embodiment of a memory package.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

Figure 2:
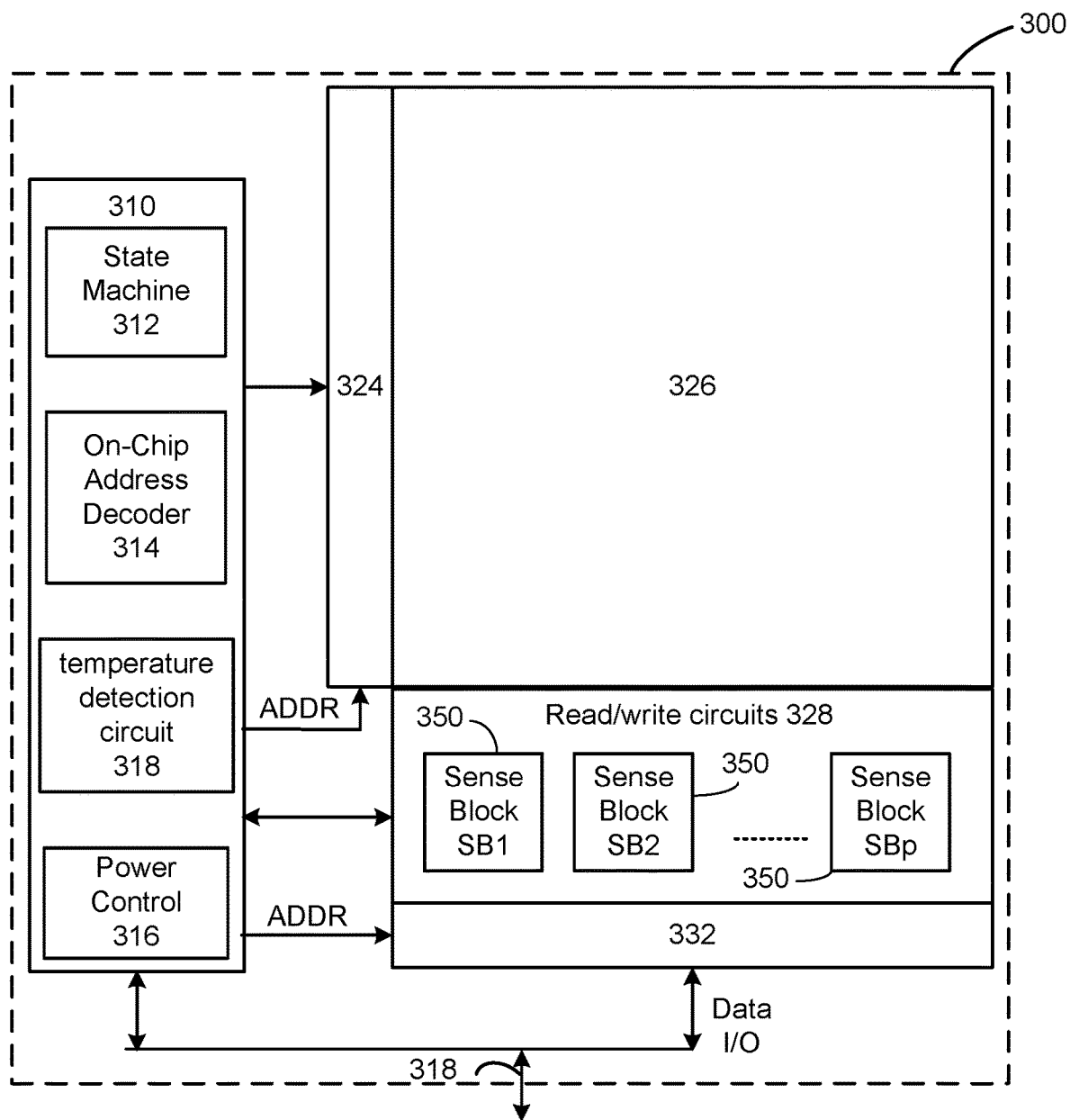
FIG. 2 is a block diagram of one embodiment of a memory die.

FIG. 2 is a functional block diagram of one embodiment of a memory die 300. Each of the one or more memory die 130 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via lines 318. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that perform the functions described below in the flow charts. In other embodiments, the control circuit can consist only of controller 102, which is an electrical circuit in combination with software (e.g., firmware), that performs the functions described below in the flow charts. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate non-volatile memory.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
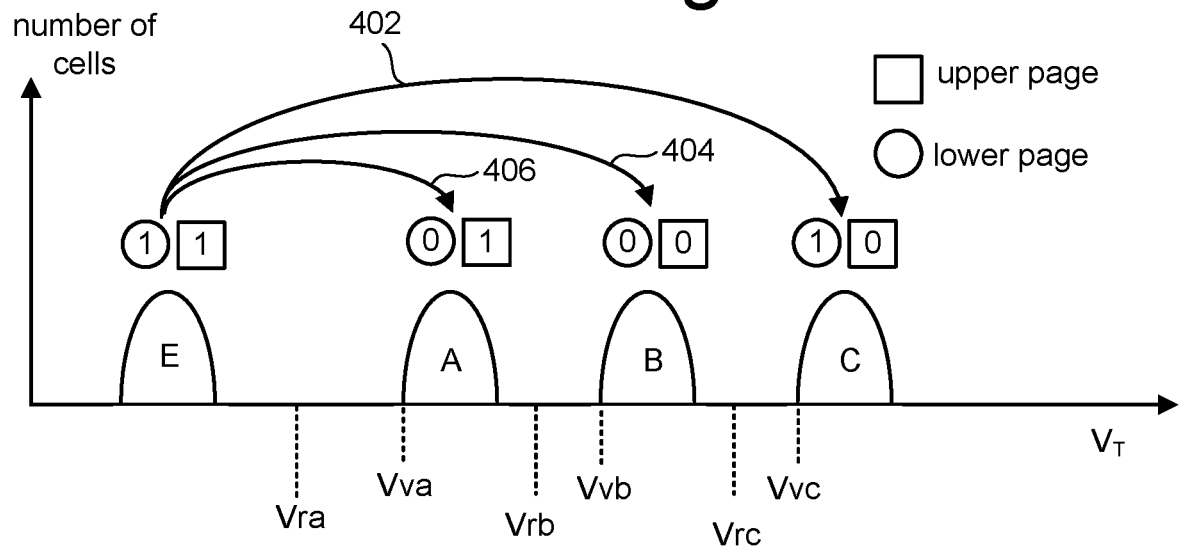
FIG. 3 depicts threshold voltage distributions and a process for programming.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 3 illustrates example threshold voltage distributions for the memory array when each memory cell stores two bits of data. Other embodiments, however, may use other data capacities per memory cell (e.g., such as one, three, four, or five bits of data per memory cell). FIG. 3 shows four threshold voltage distributions, corresponding to four data states. The first threshold voltage distribution (data state) E represents memory cells that are erased. The other three threshold voltage distributions (data states) A, B and C represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

In one embodiment, the data is stored in pages, each memory cells stores two bits of data, and each bit in a memory cell is in a different page (e.g., referred to as lower page and upper page). In one example, the erased state E stores data 11 (lower page=1, upper page=1), programmed state A stores data 01 (lower page=0, upper page=1), programmed state B stores data 00 (lower page=0, upper page=0), and programmed state C stores data 10 (lower page=1, upper page=0). Note that although specific bit patterns have been assigned to each of the states, different bit patterns may also be assigned. The terms "lower" and "upper" to describe the pages of data are only labels and other labels can also be used (e.g., first page and second page, etc.)

FIG. 3 shows three read reference voltages, Vra, Vrb, and Vrc for reading data from memory cells. By testing (e.g., performing sense operations) whether the threshold voltage of a given memory cell is above or below the three read reference voltages, the system can determine what data state (e.g., E, A, B or C) a memory cell is in.

FIG. 3 also shows three verify reference voltages, Vva, Vvb, and Vvc. When programming memory cells to data state A, the system will test whether those memory cells have a threshold voltage greater than or equal to Vva. When programming memory cells to data state B, the system will test whether the memory cells have threshold voltages greater than or equal to Vvb. When programming memory cells to data state C, the system will determine whether memory cells have their threshold voltage greater than or equal to Vvc.

In one embodiment, known as full sequence programming, memory cells can be programmed from the erased data state E directly to any of the programmed data states A, B or C. For example, a population of memory cells to be programmed may first be erased so that all memory cells in the population are in erased data state E. Then, a programming process is used to program memory cells directly into data states A, B and C. For example, while some memory cells are being programmed from data state E to data state A (arrow 406), other memory cells are being programmed from data state E to data state B (arrow 404) and/or from data state E to data state C (arrow 402). The arrows 402, 404 and 406 of FIG. 3 represent the full sequence programming. The technology described herein can also be used with other types of programming in addition to full sequence programming (including, but not limited to, multiple stage/phase programming). In some embodiments, data states A, B and C can overlap, with controller 102 relying on error correction to identify the correct data being stored.

Figure 4:
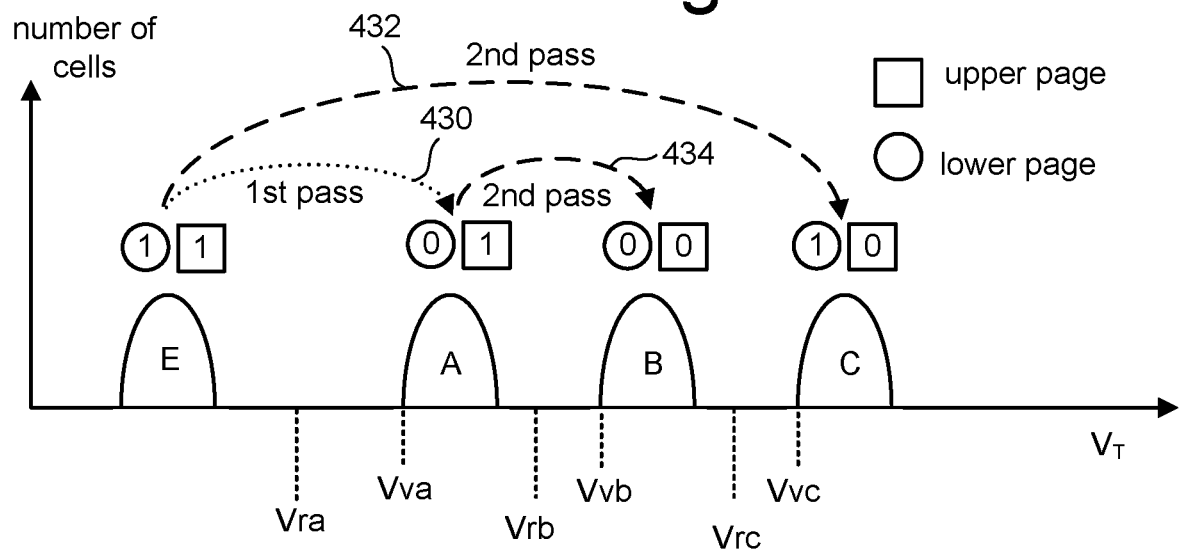
FIG. 4 depicts threshold voltage distributions and a process for programming.

FIG. 4 depicts one example of a two-stage (or two phase) technique of programming a multi-state memory cell that stores data for two different pages: a lower page and an upper page. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 430.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 432. If the memory cell had been programmed into state A as a result of the first programming stage, then the memory cell is further programmed in the second stage so that the threshold voltage is increased to be within state B, as depicted by arrow 434. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing in the mode that programs the lower page and convert to full sequence programming mode if enough data is subsequently received.

Figure 5:
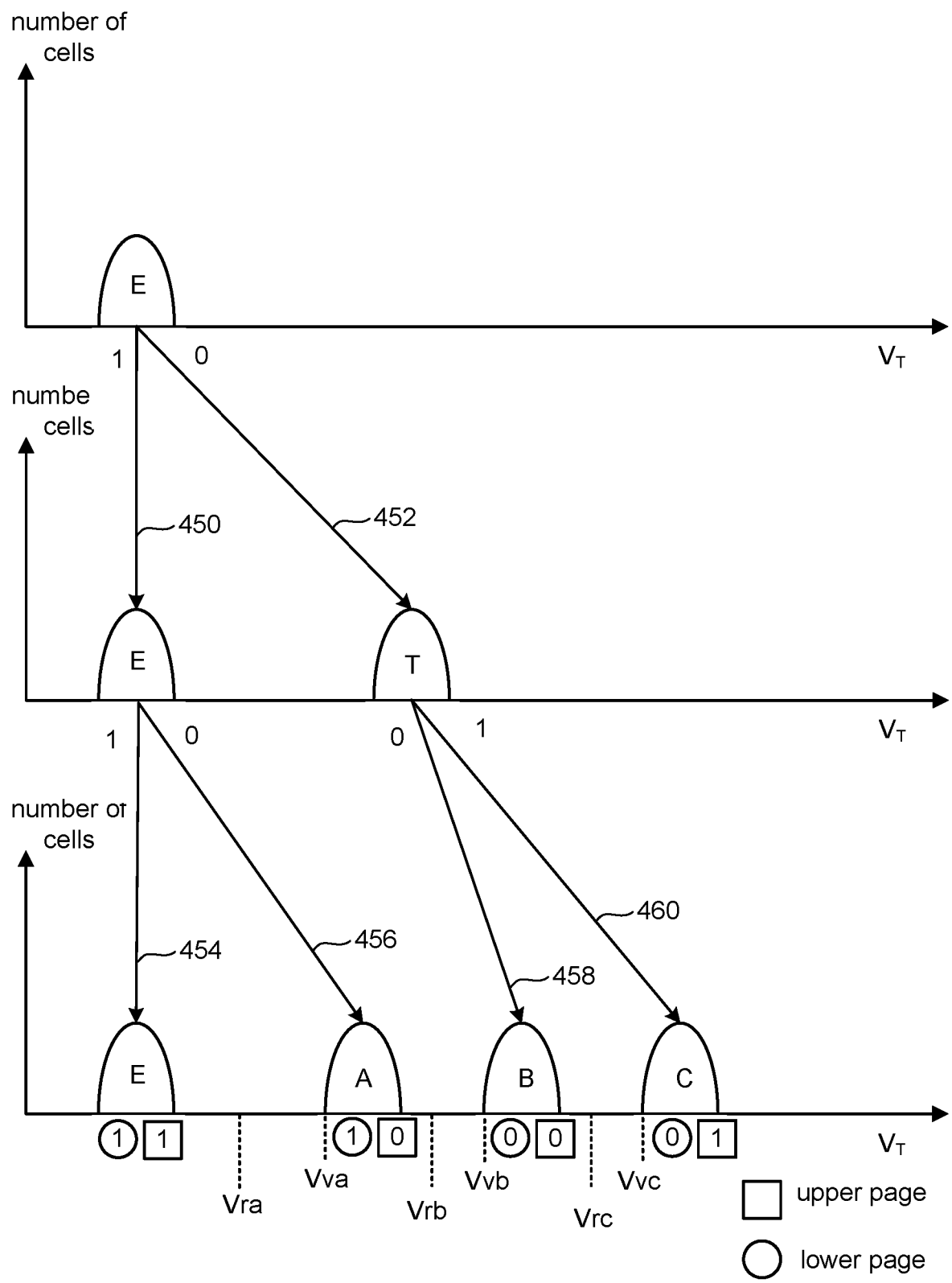
FIG. 5 depicts threshold voltage distributions and a process for programming.

FIG. 5 depicts another example of a two-stage (or two phase) technique of programming a multi-state memory cell that stores data for two different pages: a lower page and an upper page. In this embodiment, the erased state E stores data 11 (lower page=1, upper page=1), programmed state A stores data 10 (lower page=1, upper page=0), programmed state B stores data 00 (lower page=0, upper page=0), and programmed state C stores data 01 (lower page=0, upper page=1). In the first programming stage, those memory cells targeted to be in state E or state A, remain in state E (arrow 450). Those memory cells targeted to be in state B or state C are programmed to temporary threshold voltage distribution T (arrow 452). In the second programming stage, memory cells being programmed to store data 11 remain in state E (arrow 454), memory cells being programmed to store data 10 are programmed from state E to state A (arrow 456), memory cells being programmed to store data 00 are programmed from temporary threshold voltage distribution T to state B (arrow 458), and memory cells being programmed to store data 01 are programmed from temporary threshold voltage distribution T to state C (arrow 460).

Figure 6:
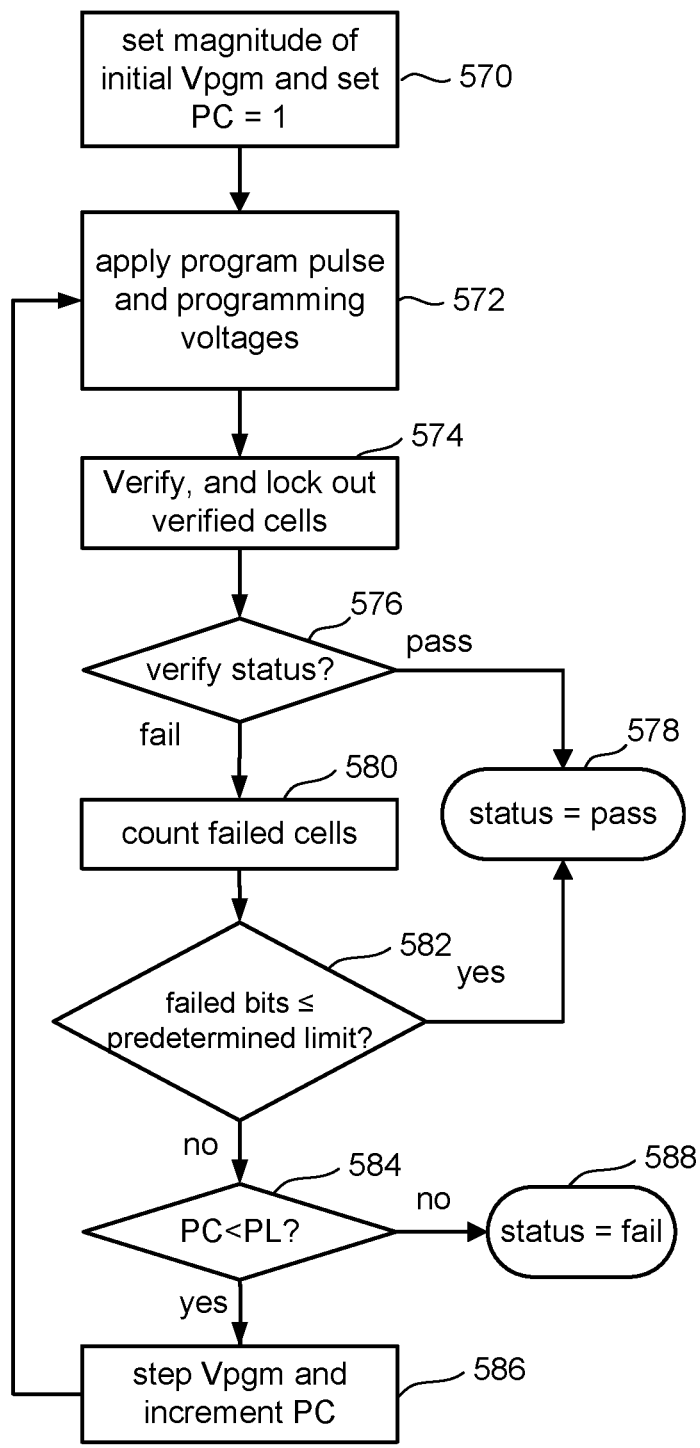
FIG. 6 is a flow chart describing one embodiment of a process for programming performed by a memory die.

FIG. 6 is a flowchart describing one embodiment of a process for programming that is performed by memory die 300. In one example embodiment, the process of FIG. 6 is performed on memory die 300 using the control circuit discussed above, at the direction of state machine 312. The process of FIG. 6 is performed to implement the programming schemes of FIG. 3, 4 or 5, as well as other programming schemes. When implementing the programming scheme of FIG. 4 or 5, the process of FIG. 6 is used to implement any/each stage of the multi-stage programming process.

Typically, the program voltage applied to the control gates (via a selected word line) during a program operation is applied as a series of program pulses (voltage pulses). Between programming pulses are a set of verify pulses to perform verification. In many implementations, the magnitude of the program pulses is increased with each successive pulse by a predetermined step size. In step 570 of FIG. 6, the programming voltage (Vpgm) is initialized to the starting magnitude (e.g., ~12-16V or another suitable level) and a program counter PC maintained by state machine 312 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target states. A status of "PASS" (or success) is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by the state machine 312, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to one or more thresholds in step 582.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line so that another iteration (steps 572-586) of the programming process of FIG. 6 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engines 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engines 226/256) to multiple pages encoded across a number of storage elements, but they do not need to be applied across multiple pages. The data bits can be mapped to a logical page and stored in memory structure 326 by programming one or more memory cells to one or more programming states, which corresponds to v.

In one possible implementation, an iterative probabilistic decoding process is used (e.g., by ECC engines 226/256) when reading data which implements error correction decoding corresponding to the encoding implemented in the controller 102. Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by:

$$Q = \log_2 \frac{P(v=0 \mid Y)}{P(v=1 \mid Y)}$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

When reading data, controller 102 (e.g., by ECC engines 226/256) receives the code word Y1 and accesses the LLRs and iterates in successive iterations in which it determines if parity checks of the error encoding process have been satisfied. If all parity checks have been satisfied, the decoding process has converged and the code word has been successfully error corrected (decoded). If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

In some embodiments, a copy of data being programmed is preserved internally or externally to the memory die for verification purposes, such that if a programming operation for that data fails, the data preserved through one or more copies can be programmed elsewhere on the memory die or on a different memory die. In some embodiments, the failed region of the memory die, which can be a page, a block, one or more word lines, or region of some other size, can be marked to prevent future programming attempts. For example, some embodiments of the present technology may preserve a page being programmed and the data on pages physically close to the page(s) being programmed, or the page being programmed can be combined with corresponding pages on other planes and/or other memory dies. This data can be combined using XOR operations (e.g., by XOR engines 224/254) to save storage space. This combined data may be kept on external data latches, controller RAM (e.g., DRAM 106), locations in the memory die (e.g., in the non-volatile memory array 326), or elsewhere. Other operations for combining, other than XOR, can also be used.

In embodiments wherein the memory system consists of multiple memory die, corresponding regions of each memory die may be combined together via one or more XOR operations (or other logical/mathematical operations) while part or all of one or more of those regions is/are being programmed. In one example, the XOR data is stored in DRAM 106 or in one of the memory die in the memory system. After the programming operation is complete, in order to verify that the programming operation was successful, the memory system may read the data page(s) that were programmed and/or data surrounding the newly programmed pages. If any of these read operations fail, the system may perform one or more XOR operations (or other logical/mathematical operations) on the stored combined data with the regions not currently programmed, thus recovering a safe copy of the original data to be programmed. The system may then locate a free region of memory on which to program the saved (recovered) copy.

Sometimes a programming process can result in errors in the data; however, the data programmed is left in the memory because the system (e.g., controller 102) decides that the errors can be corrected during reading using ECC (as discussed above). For example, a programming process can end with a status of "fail" (see step 588 of FIG. 6) being reported back from the memory die to the controller. The controller may then attempt to read the newly programmed data and decode the data read using the ECC process. If the controller can fix the errors in the programmed data using ECC, then the controller may choose to keep the data where it is rather than reprogram. However, there can be instances where faulty programming may lead to a disruption of how data is stored in a memory array. For example, damaged data that can be corrected now can become uncorrectable due to additional errors developed afterwards. Also, data can be inadvertently moved to a different page. Consider the two bit per memory cell embodiment of FIG. 5. A faulty programming process may cause the lower page data to move into the position of the upper page. Later on, when reading the data, the ECC process may be successful but the wrong page is returned. In some prior art systems, data is stored with an LBA tag, which indicates the address on the drive that the data is associated with. If data is corrupted such that a page of data moves to a different page location, the read process may still be able to decode the data read but the LBA tag would not match. Thus, the wrong data can be returned to the host, or the controller will realize that the data is wrong but the controller is unable to fix the errors at the level where this is detected. This situation is not desirable as it typically results in data loss.

Additionally, a controller can schedule a task to be done at a later time or put the task into a queue. For example, if the controller can read and successfully decode the data of a failed programming process, the controller may schedule a task for reprogramming the fixed data at a later time. But if there is a garbage collection process in the interim, the data could be lost forever.

A proposed solution is that when the memory die encounters a program error of sufficient severity, the memory die will destroy the data so that the data cannot be correctable and will need to be recovered (e.g., using the XOR) and re-programmed.

Figure 7:
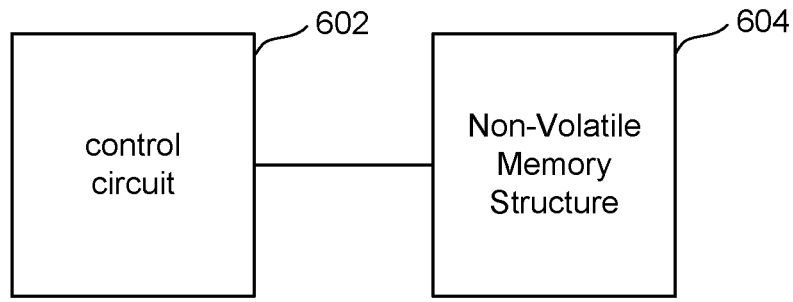
FIG. 7 is a block diagram depicting one embodiment of a memory system.
Figure 8:
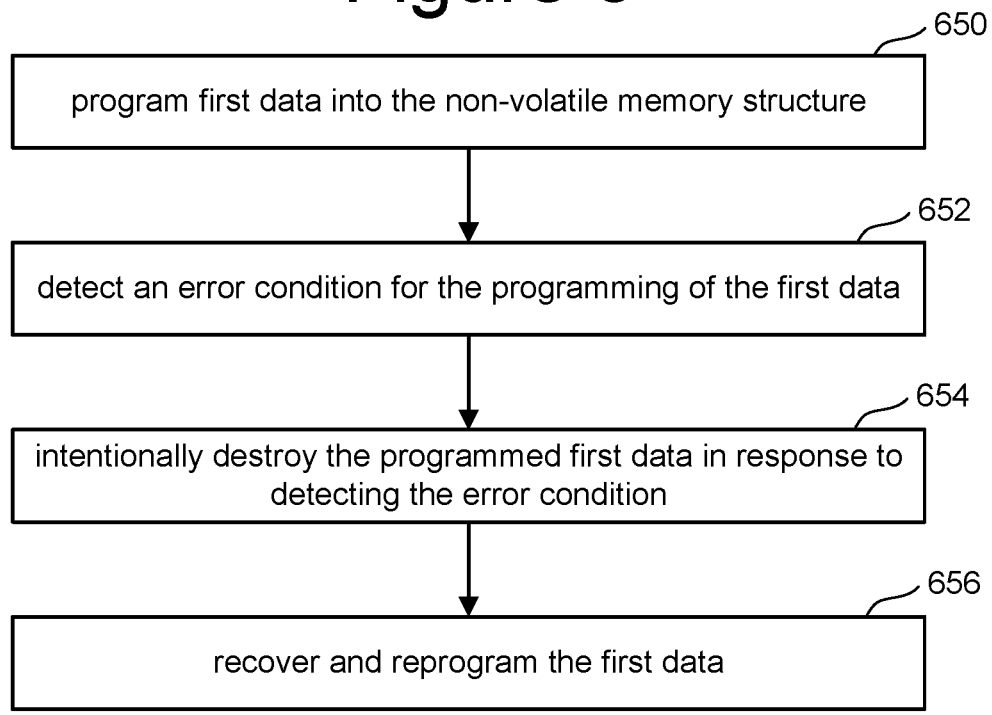
FIG. 8 is a flow chart describing one embodiment of a process for operating a non-volatile storage apparatus to write data.

FIG. 7 depicts a control circuit 602 connected to a non-volatile memory structure 604, and is being depicted to generally describe the proposed solution herein. FIG. 8 is a high level flow chart illustrating one embodiment for operating the structure of FIG. 7 to perform a process of writing data according to the proposed solution. Control circuit 602 of FIG. 7 can be any of the embodiments of a control circuit described above, including a controller, an on-die state machine, an on-die microcontroller, an on-die microprocessor or a combination of the above. Non-volatile memory structure 604 can be a memory array or other arrangement, and can represent non-volatile memory cells on one die, multiple dies, one plane or multiple planes. Thus, the structure of FIG. 7 serves as a generalization of the structures of FIGS. 1A-D and FIG. 2.

Control circuit 602 is configured to program first data into the non-volatile memory structure 604 in step 650. Control circuit 602 is further configured to detect an error condition for the programming of the first data in step 652. In response to detecting the error condition, control circuit 602 intentionally destroys the programmed first data in in step 654 so that the first data is not correctable using ECC. Because the programming failed and the first data has been destroyed so that it is not correctable (i.e. the data is corrupted) using ECC in the memory system (e.g., by ECC engines 226/256), the first data is recovered and reprogrammed in step 656. Thus, the first data is intentionally destroyed to force a reprogramming of the first data. In one embodiment, the control circuit is configured to program the first data into a first location in the non-volatile memory structure while the reprogramming is to a second (different) location in the non-volatile memory structure (same die or different die).

Figure 9B:
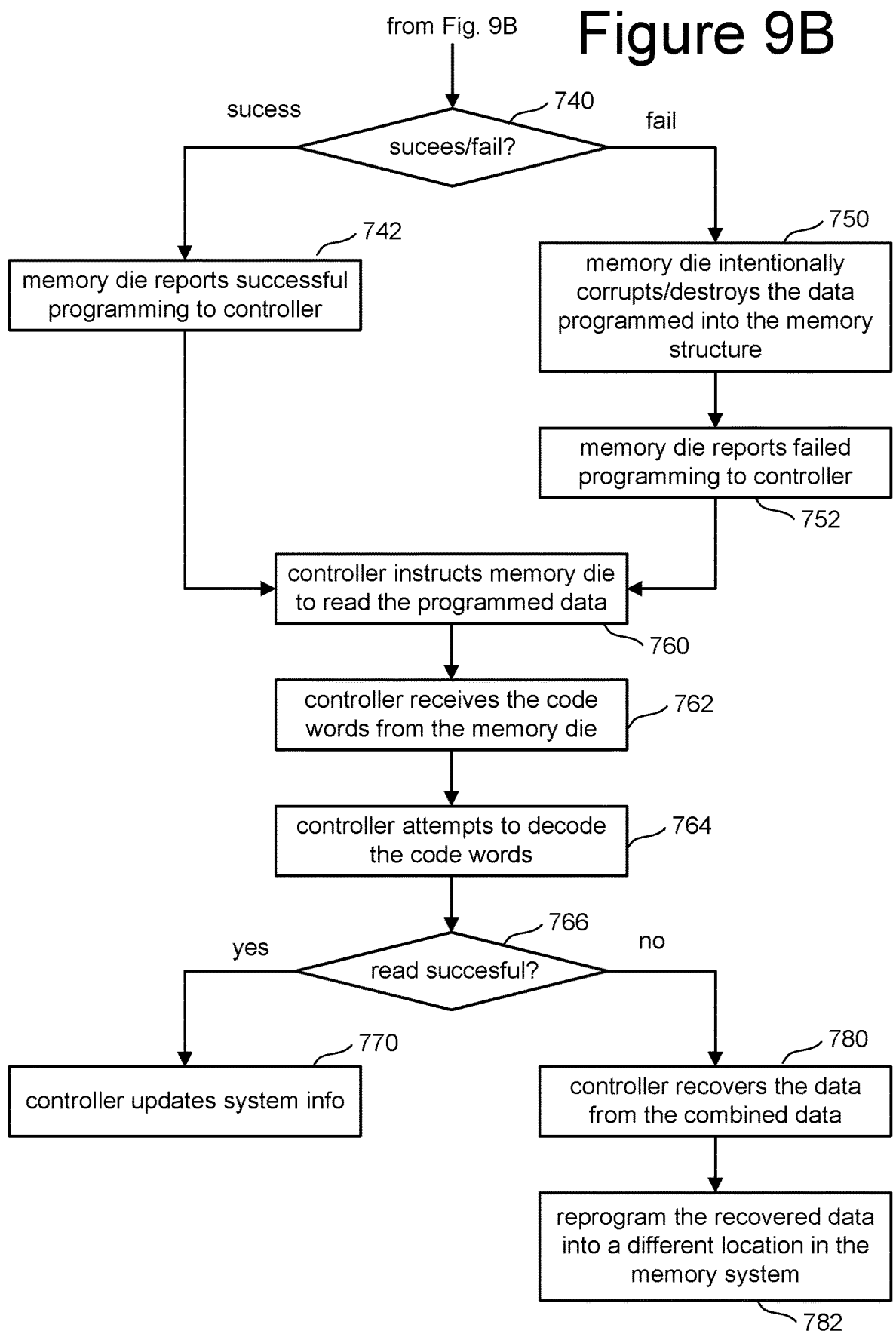

FIGS. 9A and 9B together are a flow chart describing one embodiment of a process for operating a non-volatile storage apparatus (such as the structure of FIGS. 1A-D and FIG. 2, and FIG. 7) to write data as proposed herein. The flow chart of FIGS. 9A and 9B represents a more detailed example of one embodiment of the process of FIG. 8.

In step 702 of FIG. 9A, controller 102 receives data from a host or other entity external to the memory system. This data can be referred to as host data, user data or data from an entity external to the memory system. In step 704, controller 102 (e.g., by ECC engines 226/256) adds error correction to the received data, for example, as described above. The data received may include a logical block address (LBA). In step 706, controller 102 chooses a physical location in the non-volatile memory to store the data. In some embodiments, the memory system includes a plurality of memory dies each including a non-volatile memory array and a controller connected to the memory dies. In such an embodiment, controller 102 chooses one or more dies to program the data into and locations (e.g., blocks and pages) within the chosen die(s) to program the data.

Figure 10:
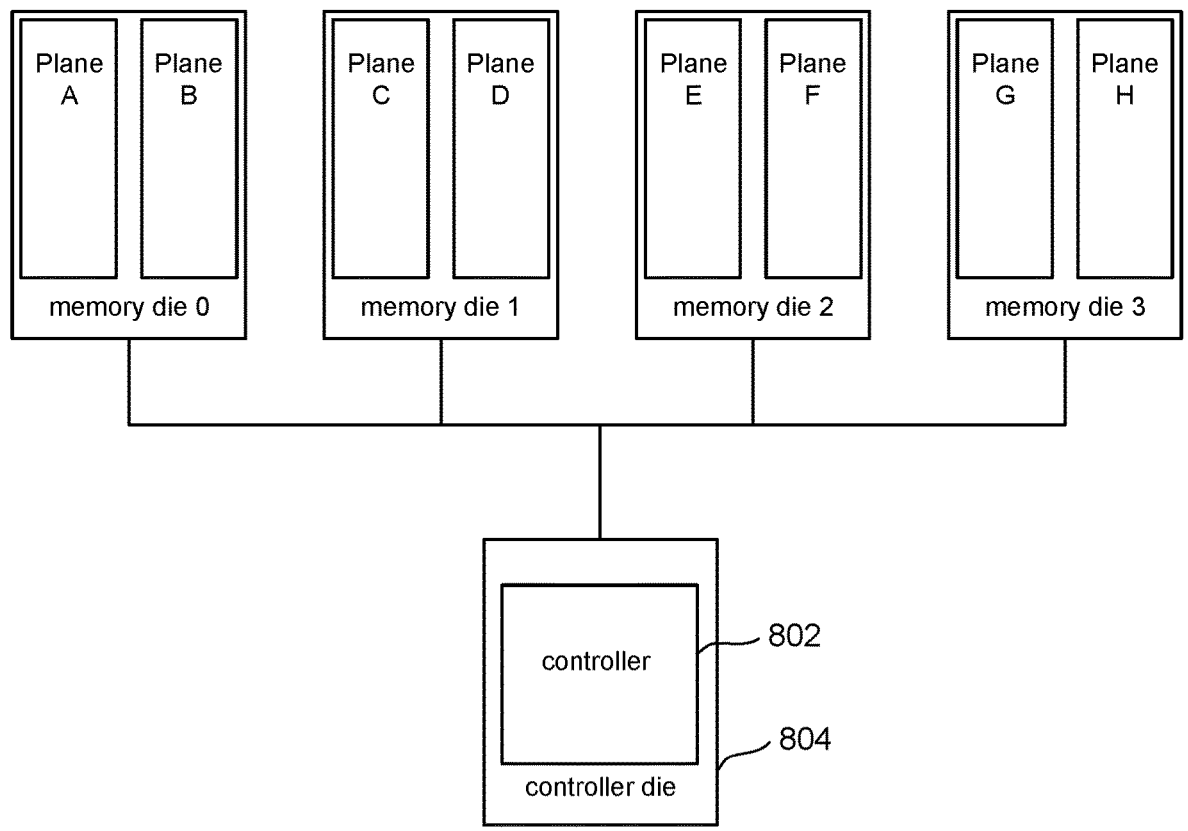
FIG. 10 is a block diagram depicting one embodiment of a memory system.

In step 708 of FIG. 9A, controller 102 combines the data received in step 702 with other data already programmed (written to) into and stored in the memory system to create combined data. For example, controller 102 (e.g., XOR engines 224/254) may use an XOR operation to combine the data. FIG. 10 provides additional details for the combining of data in step 708. FIG. 10 shows the non-volatile storage apparatus including a plurality of memory dies connected to a controller 802 on a controller die 804 that is physically separate from the multiple memory die (e.g., the controller is on a separate die). Each memory die includes a non-volatile memory array. Controller 802 of FIG. 10 is an example of controller 102 of FIG. 1A. FIG. 10 shows four memory die: memory die 0, memory die 1, memory die 2 and memory die 3. In other embodiments, more or less than four memory die can be used. Each of the memory die includes two planes. Memory die 0 includes Plane A and Plane B. Memory die 1 includes Plane C and Plane D. Memory die 2 includes Plane E and Plane F. Memory die 3 includes Plane G and Plane H. In other embodiments, a memory die can include one plane or more than two planes. Memory Dies 0-3 are examples of memory 104 of FIG. 1A, and any of memory dies 0-3 can be implemented as memory die 300.

As will be discussed in more detail below, the controller is configured to instruct the memory dies to program sets of data into the memory arrays and the controller is configured to maintain a combination of copies of the sets of data for multiple memory dies. Each memory die is configured to start programming of a respective set of the data into a respective set of memory cells, determine that the programming terminates with a fatal condition, apply one or more additional voltage pulses to the respective memory cells to destroy the respective set of the data and return a status of programming failure to the controller. In response to the failed programming, the controller is configured to recover the data using the combined copies and instruct one or more of the memory dies to reprogram the data in response to the status of programming failure.

There are multiple ways to combine copies of data. In one embodiment, corresponding physical locations in all planes except the last plane are combined (e.g., XOR'd) and stored in the corresponding location in the last plane. For example, such an arrangement would use the following formula to combine data:

$$H(x)=A(x)\text{XOR } B(x)\text{XOR } C(x)\text{XOR } D(x)\text{XOR } E(x) \text{ XOR } F(x)\text{XOR } G(x)$$

where A(x) is physical location x in Plane A, B(x) is physical location x in Plane B, C(x) is physical location x in Plane C, D(x) is physical location x in Plane D, E(x) is physical location x in Plane E, F(x) is physical location x in Plane F, G(x) is physical location x in Plane G, and H(x) is physical location x in Plane H.

When programming new data into G(x), the controller can add the new data into the combination (e.g., perform step 708) by reading the data at H(x), combining the data read at H(x) with the new data using XOR, and then storing the result back into H(x).

If a programming process for a memory due fails, the data can be recovered by XOR'ing the data from the other memory die with the corresponding data in Plane H. For example, if the programming process for G(x) fails, then the data for F(x) can be recovered by reading the data at A(x), B(x), C(x), D(x), E(x), F(x), and H(x) and performing the following operation:

$$G(x)=A(x)\text{XOR } B(x)\text{XOR } C(x)\text{XOR } D(x)\text{XOR } E(x) \text{ XOR } F(x)\text{XOR } H(x)$$

In another embodiment, the left and right side planes are kept as separate combinations, which provides for faster operation but at the costs of area used. Planes G and H would be used to store the combines sets of data. For example, such an arrangement would use the following formula to combine data:

$$G(x)=A(x)\text{XOR } C(x)\text{XOR } E(x)$$

$$H(x)=B(x)\text{XOR } D(x)\text{XOR } F(x)$$

Looking back at FIG. 9A, in step 710 controller 102 sends instructions to one or more memory die 300 to program data. In step 712, controller 102 sends one or more addresses to one or more memory die 300. The one or more addresses indicate where to program the data. In step 714, controller 102 sends the data to be programmed to the one or more memory die 300. In step 716, the addressed memory die 300 (one or multiple memory die) performs the programming process to program the data into addressed location in the memory structure (e.g. memory array) on the memory die 300. For example, the process of FIG. 6 is performed one or multiple times. In step 718, memory die 300 determines that the programming process has ended. The programming process can end as a success (e.g., step 578 of FIG. 6) or as a failure (e.g., step 588 pf FIG. 6). The programming process can fail because it has not completed by the maximum allowed programming pulses. Alternatively, the programming process can fail because a maximum time has been reached, the memory cells are programming too slow, a maximum programming voltage has been reached, too many error bits exists, or other condition. If the programming process ended as a success (step 740 of FIG. 9B), then in step 742 memory die 300 reports to controller 102 that the programming process ended successfully.

If memory die 300 determines that the programming process ended as a failure (step 740 of FIG. 9B), then in step 750 memory die intentionally corrupts/destroys the data programmed into the memory structure. There are many way to corrupt/destroy the data already programmed into the memory cells. In one embodiment, the data is destroyed by applying one or more additional program pulses (voltage pulses) to the memory cells storing the data. Other embodiments for destroying the data include applying an erase operation to memory cells storing the programmed data, programming different data into the memory cells storing the programmed data (e.g., programming over the data) where the different data can be random data or a predetermined pattern, applying a voltage pulse to the entire block of memory cells where the data is being stored, and applying one or more additional programming pulses to multiple word lines of the block of memory cells where the data is being stored. Step 740 includes making the data uncorrectable using ECC in the memory system.

Figure 11:
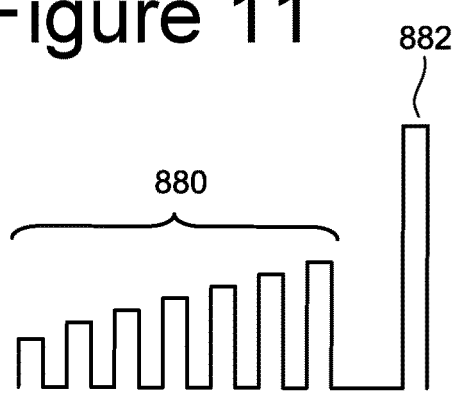
FIG. 11 depicts a voltage waveform applied to a selected word line during a programming process.

FIG. 11 depicts more details about one embodiment of destroying the data by applying one or more additional program pulses (voltage pulses) to the memory cells storing the data. FIG. 11 is a graph of the voltage signa Vpgm applied to the selected word line for programming. This voltage signal includes a set of voltage pulses 880 that are applied during step 572 of FIG. 6. The pulses increase in magnitude by a predetermined step size (e.g., 0.1 volts, 0.2 volts, 0.6 volts, or other amount). If the programming process fails, the memory die 300 (e.g., at the direction of the state machine) can cause an additional program pulse 882 to be applied to the selected/common word line (which causes the voltage pulse to be applied to the control gates of the memory cells that are storing the faulty data just programmed). The magnitude of voltage pulse 882 is significantly higher than the magnitudes of the plurality of voltage pulses. 880 In one embodiment, the magnitude of voltage pulse 882 is higher than a highest magnitude of the plurality of voltage pulses 880, by more than the step size.

Looking back at FIG. 9B, after intentionally destroying the data, memory die 300 reports to controller 102 in step 752 that the programming process failed. After the programming process ends (either step 742 or step 752), controller 102 attempts to read the data by sending an instruction to memory die 300 to perform a read process. The read process includes the memory die 300 sensing the data state (see FIGS. 3-5) and sending sensed code words back to the controller. The code words includes the data and the error correction information. In step 762, controller 102 receives the code words from memory die 300. In step 764, controller 102 (e.g., ECC engines 226/256) attempts to decode the code words, as discussed above. Decoding the code words can include correcting some errors. If controller 102 (e.g., ECC engines 226/256) is able to decode the code words, the read process is successful and in step 770 controller updates the system information that it maintains. In one embodiment, the system maintains tables of data that indicate status information for each block. This information may include a mapping of logical addresses to physical addresses, which blocks/word lines are open/closed, which blocks/word lines are bad, etc.

If controller 102 (e.g., ECC engines 226/256) is not able to successfully decode the code words, the read process is not successful (the data cannot be successfully read) and in step 780 controller 102 recovers the data from the stored combined data. For example, as discussed above with respect to FIG. 10, controller reads the XOR combination and the other data values used to make the combination, and then uses XOR operations to recovered the data for the failed programming process. Note that data intentionally corrupted/destroyed in step 750 will not be read successfully (e.g., cannot be decoded successfully in step 764).

In step 782, the recovered data is reprogrammed into a different location (same die or different die) than the programming of step 716. Step 782 includes the controller choosing a new location, the controller instructing a memory die to program the recovered data into the location, and a memory die performing the programming in response to the controller. In one embodiment, step 782 includes performing the process of FIGS. 9A and 9B.

The flow chart of FIGS. 9A and 9B describe certain functions being performed by controller 102 and certain functions performed on memory die 300 (e.g., by control circuitry 310 or another on-die processor). In other embodiments, all of the functions can be performed on memory die 300 (e.g., by control circuitry 310 or another on-die processor). In another embodiment, steps 716-782 are performed on memory die 300 (e.g., by control circuitry 310 or another on-die processor). In another embodiment, step 740 (determining that the programming failed) and/or step 750 (destroying the data) is performed by controller 102. Thus, the division of labor between the controller and the memory die can vary in relation to the discussion above.

A memory system has been described that includes a novel program failure behavior that catastrophically corrupts data of a failed/faulted programming process rather than giving up in a manner that preserves the damaged data and risks unrecoverable errors later on.

One embodiment includes a non-volatile storage apparatus comprising a non-volatile memory structure and a control circuit connected to the non-volatile memory structure. The control circuit is configured to program first data into the non-volatile memory structure. The control circuit is configured to detect an error condition for the programming of the first data and intentionally destroy the programmed first data in response to detecting the error condition.

One embodiment includes a method of operating a non-volatile storage apparatus, comprising receiving first data from an entity external to the non-volatile storage apparatus; performing a programming process to program the first data into a first location in non-volatile storage; determining that the programming process ended and failed; and intentionally corrupting the first data programmed into the first location in the non-volatile storage.

One embodiment includes a non-volatile storage apparatus comprising a plurality of memory dies each including a non-volatile memory array and a controller connected to the memory dies. The controller is configured to instruct the memory dies to program sets of data into the memory arrays. The controller is configured to maintain a combination of copies of the sets of data for multiple memory dies. Each memory die is configured to start programming of a respective set of the data into a respective set of memory cells, determine that the programming terminates with a fatal condition, apply one or more additional voltage pulses to the respective memory cells to destroy the respective set of the data and return a status of programming failure to the controller. The controller is configured to recover the data using the combination of copies and instruct one or more of the memory dies to reprogram the data in response to the status of programming failure.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a non-volatile memory structure; and
   a control circuit connected to the non-volatile memory structure, the control circuit is configured to program first data into the non-volatile memory structure, the control circuit is configured to detect an error condition for the programming of the first data, the control circuit is configured to intentionally change and destroy the programmed first data in response to detecting the error condition for the programming of the first data, the intentionally changing and destroying the programmed first data includes corrupting the first data and making the first data not correctable using ECC on the non-volatile storage apparatus.

2. The non-volatile storage apparatus of claim 1, wherein:
   the error condition is that the programming ended and failed.

3. The non-volatile storage apparatus of claim 1, wherein:
   the control circuit is configured to program the first data into a first location in the non-volatile memory structure;
   the control circuit is configured to intentionally change and destroy the programmed first data in order to force a reprogramming of the first data; and
   the control circuit is configured to reprogram the first data into a second location in the non-volatile memory structure subsequent to intentionally destroying the programmed first data.

4. The non-volatile storage apparatus of claim 1, wherein:
   the control circuit is configured to program the first data into the non-volatile memory structure by applying a plurality of programming voltage pulses to a plurality of memory cells; and
   the control circuit is configured to intentionally change and destroy the programmed first data by applying one or more additional programming voltage pulses to plurality of memory cells while the first data is stored in the plurality of memory cells.

5. The non-volatile storage apparatus of claim 1, wherein:
   the control circuit is configured to program the first data into the non-volatile memory structure by applying a plurality of voltage pulses to a plurality of memory cells, the voltage pulses increase in magnitude by a step size; and the control circuit is configured to intentionally change and destroy the programmed first data by applying an additional voltage pulse to the plurality of memory cells at a magnitude that is higher than a highest magnitude of the plurality of voltage pulses by more than the step size.

6. The non-volatile storage apparatus of claim 1, wherein:
the control circuit is configured intentionally change and destroy the programmed first data by applying an erase operation to memory cells storing the programmed first data.

7. The non-volatile storage apparatus of claim 1, wherein:
the control circuit is configured to intentionally change and destroy the programmed first data by programming different data into the memory cells while the memory cells are storing the programmed first data.

8. The non-volatile storage apparatus of claim 1, wherein:
the control circuit is configured to program the first data into the non-volatile memory structure by programming the first data into a plurality of memory cells connected to a common word line in a block of memory cells; and
the control circuit is configured intentionally change and destroy the programmed first data by applying one or more additional programming pulses to multiple word lines of the block of memory cells.

9. The non-volatile storage apparatus of claim 1, wherein:
the first data is user data received from a computing apparatus external to the non-volatile storage apparatus;
the non-volatile memory structure is on a first die; and
the control circuit includes a controller on a second die.

10. The non-volatile storage apparatus of claim 1, wherein:
the control circuit is configured to program the first data into a first location in the non-volatile memory structure;
the control circuit is configured to read the destroyed first data and determine that the destroyed first data is not successfully readable; and
the control circuit is configured to reprogram the first data into a second location in the non-volatile memory structure in response to determining that the destroyed first data is not successfully readable.

11. The non-volatile storage apparatus of claim 1, wherein:
the control circuit is configured to program the first data into a first location in the non-volatile memory structure;
the control circuit is configured to combine the first data with other data to create combined data;
the control circuit is configured to recover the first data from the combined data subsequent to intentionally destroying the programmed first data; and
the control circuit is configured to reprogram the recovered first data into a second location in the non-volatile memory structure.

12. The non-volatile storage apparatus of claim 1, wherein:
the control circuit is configured to program the first data into a first location in the non-volatile memory structure;
the control circuit is configured to combine the first data with other data to create combined data;
the control circuit is configured to read the destroyed first data and determine that the destroyed first data is not successfully readable;
the control circuit is configured to recover the first data from the combined data in response to determining that the destroyed first data is not successfully readable; and
the control circuit is configured to reprogram the recovered first data into a second location in the non-volatile memory structure.

13. The non-volatile storage apparatus of claim 1, wherein the non-volatile memory structure and the control circuit are on a first memory die, the non-volatile storage apparatus further comprises:
a controller in communication with the first memory die, the controller receives the first data from an entity external to the non-volatile storage apparatus, the control circuit configured to report to the controller that the programming failed, the control circuit is configured to program the first data into a first location in the non-volatile memory structure, the controller is configured to combine the first data with other data to create combined data prior to programming the first data into the first location, the controller is configured to read the destroyed first data and determine that the destroyed first data is not successfully readable, the controller is configured to recover the first data from the combined data in response to determining that the destroyed first data is not successfully readable, the controller is configured to request that the recovered first data be reprogrammed into a second location on the memory die or on a different die.

14. The non-volatile storage apparatus of claim 1, wherein the non-volatile memory structure and the control circuit are on a first memory die, the non-volatile storage apparatus further comprises:
a plurality of additional memory dies each including a non-volatile memory array; and
a controller connected to the plurality of additional memory dies and the first memory die, the controller is configured to instruct the plurality of memory dies and the first memory die to program sets of data into the memory arrays, the controller is configured to maintain a combination of copies of the sets of data for multiple memory dies;
each memory die is configured to start programming of a respective set of the data into a respective set of memory cells, determine that the programming terminates with a fatal condition, apply one or more additional voltage pulses to the respective memory cells to destroy the respective set of the data and return a status of programming failure to the controller;
the controller is configured to recover the data using the maintained combination and instruct one or more of the memory dies to reprogram the data in response to the status of programming failure.

15. A method of operating a non-volatile storage apparatus, comprising:
receiving first data from an entity external to the non-volatile storage apparatus;
performing a programming process to program the first data into a first location in non-volatile storage;
determining that the programming process for programming the first data into the first location ended and failed; and
intentionally corrupting the first data programmed into the first location in the non-volatile storage in response to determining that the programming process for programming the first data into the first location ended and failed, the intentionally corrupting the first data programmed into the first location includes making the first data programmed into the first location not correctable using ECC on the non-volatile storage apparatus.

16. The method of claim 15, further comprising:
combining the first data with other data being stored in the non-volatile storage apparatus to create combined data;
performing a process to read the first data from the non-volatile storage after corrupting the first data;
determining that the first data cannot be successfully read;
recovering the first data from the combined data; and
programming the recovered first into a second location in the non-volatile memory.

17. The method of claim 16, wherein:
the non-volatile storage apparatus includes a memory die and a controller that is physically separate from the memory die, the memory die includes a three dimensional non-volatile NAND memory array;
the receiving first data, combining the first data, performing a process to read the first data, determining that the first data cannot be successfully read, and recovering the first data from the combined data are performed by the controller; and
the performing a programming process and intentionally corrupting the first data are performed on the memory die.

18. A non-volatile storage apparatus, comprising:
a plurality of memory dies each including a non-volatile memory array; and
a controller connected to the memory dies, the controller is configured to instruct the memory dies to program sets of data into the memory arrays, the controller is configured to maintain a combination of copies of the sets of data for multiple memory dies;
each memory die is configured to start programming of a respective set of the data into a respective set of memory cells, determine that the programming for the respective set of the data terminates with a fatal condition, apply one or more additional voltage pulses to the respective memory cells while the respective memory cells store the respective set of data in order to destroy the respective set of the data in response to determining that the programming for the respective set of the data terminated with the fatal condition, and return a status of programming failure to the controller;
each memory die is configured to destroy the respective set of the data by making the respective set of data not correctable using ECC on the non-volatile storage apparatus;
the controller is configured to recover the data using the combination of copies and instruct one or more of the memory dies to reprogram the data in response to the status of programming failure.

19. The non-volatile storage apparatus of claim 18, wherein:
the controller is configured to attempt to read the respective set of data and determine that the respective set of data is not correctable prior to recovering the data.

* * * * *